(12) United States Patent
Je (10) Patent No.: US 8,603,848 B2
(45) Date of Patent: Dec. 10, 2013

(54) THREE-DIMENSIONAL MEMS STRUCTURE AND METHOD OF MANUFACTURING THE SAME

(75) Inventor: Chang Han Je, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 480 days.

(21) Appl. No.: 12/853,522

(22) Filed: Aug. 10, 2010

(65) Prior Publication Data
US 2011/0049651 A1 Mar. 3, 2011

(30) Foreign Application Priority Data

Aug. 25, 2009 (KR) .................. 10-2009-0078465
May 6, 2010 (KR) .................. 10-2010-0042320

(51) Int. Cl.
*H01L 33/12* (2010.01)

(52) U.S. Cl.
USPC .............................. 438/50; 438/52; 257/416

(58) Field of Classification Search
USPC ............. 438/50, 52, 53, 719, 733, 739, 424, 438/736, 737, 738, 753; 257/414–420, 257/E21.511, E33.056, E21.486; 216/2, 11, 216/79
See application file for complete search history.

(56) References Cited

U.S. PATENT DOCUMENTS

| | | | |
|---|---|---|---|
| 4,819,054 A * | 4/1989 | Kawaji et al. ................. | 257/396 |
| 5,198,390 A | 3/1993 | MacDonald et al. | |
| 6,462,391 B1 * | 10/2002 | Chong et al. ................. | 257/419 |
| 6,541,831 B2 * | 4/2003 | Lee et al. ..................... | 257/415 |
| 6,905,616 B2 | 6/2005 | Kumar et al. | |
| 7,045,466 B2 * | 5/2006 | Subramanian et al. ....... | 438/712 |
| 7,105,819 B2 * | 9/2006 | Ryu et al. .................... | 250/338.3 |
| 7,166,488 B2 * | 1/2007 | MacDonald et al. ......... | 438/52 |
| 7,439,093 B2 * | 10/2008 | Beaudry ....................... | 438/48 |
| 7,858,476 B2 * | 12/2010 | Cho et al. ..................... | 438/270 |
| 7,932,118 B2 * | 4/2011 | Robert et al. ................. | 438/53 |
| 8,357,560 B2 | 1/2013 | Pyo et al. | |

(Continued)

FOREIGN PATENT DOCUMENTS

| | | |
|---|---|---|
| EP | 1 619 164 A2 | 1/2006 |
| KR | 1020050111269 A | 11/2005 |
| KR | 10-0732698 B1 | 6/2007 |
| KR | 10-2007-0119247 A | 12/2007 |

OTHER PUBLICATIONS

Jongpal Kim et al., "An X-Axis Single-Crystalline Silicon Microgyroscope Fabricated by the Extended SBM Process", Journal of Microelectromechanical Systems, Jun. 2005, pp. 444-455, vol. 14, No. 3, IEEE.

(Continued)

*Primary Examiner* — Cuong Q Nguyen
*Assistant Examiner* — Yosef Gebreyesus (57) ABSTRACT

Provided are a three-dimensional (3D) MEMS structure and a method of manufacturing the same. The method of manufacturing the 3D MEMS structure having a floating structure includes depositing a first etch mask on a substrate, etching at least two regions of the first etch mask to expose the substrate, and forming at least one step in the etched region, partially etching the exposed region of the substrate using the first etch mask, and forming at least two grooves, depositing a second etch mask on a sidewall of the groove, and performing an etching process to connect lower regions of the at least two grooves to each other, and forming at least one floating structure.

15 Claims, 8 Drawing Sheets

(56) References Cited

U.S. PATENT DOCUMENTS

| | | | |
|---|---|---|---|
| 2002/0163051 A1* | 11/2002 | Gopal et al. | 257/414 |
| 2002/0164833 A1* | 11/2002 | Cho et al. | 438/50 |
| 2004/0067346 A1* | 4/2004 | Hofmann et al. | 428/195.1 |
| 2006/0290449 A1* | 12/2006 | Piazza et al. | 333/187 |
| 2007/0281493 A1* | 12/2007 | Fucsko et al. | 438/739 |
| 2008/0315332 A1* | 12/2008 | Kaelberer et al. | 257/415 |

OTHER PUBLICATIONS

Kevin A. Shaw et al., "SCREAM I: A Single Mask, Single-Crystal Silicon Process for Microelectromechanical Structures", 1993, pp. 155-160, IEEE.

* cited by examiner

THREE-DIMENSIONAL MEMS STRUCTURE AND METHOD OF MANUFACTURING THE SAME

CROSS-REFERENCE TO RELATED APPLICATION

This application claims priority to and the benefit of Korean Patent Application No. 10-2009-0078465, filed Aug. 25, 2009 and Korean Patent Application No. 10-2010-0042320, filed May 6, 2010, the disclosure of which is incorporated herein by reference in its entirety.

BACKGROUND

1. Field of the Invention

The present invention relates to a three-dimensional (3D) MEMS structure and a method of manufacturing the same, and more particularly, to a method of manufacturing a 3D MEMS microstructure capable of forming a floating structure having a step in a simple process without a specific wafer and a 3D MEMS structure manufactured thereby.

2. Discussion of Related Art

Recently, three-dimensional (3D) microelectromechanical system (MEMS) structures have been actively developed. Such 3D MEMS structures are essential in manufacturing various subcompact systems such as an acceleration sensor, a pressure sensor, a microelectromechanical switch or a biosensor.

To use the 3D MEMS structure in mechanical operating and sensing systems, it is essential to manufacture a floating structure that is spaced a predetermined distance from a substrate and freely moves. Further, a sensing electrode or microswitch needs structures having a step in a vertical direction with respect to a substrate.

To manufacture such a MEMS structure having a step, various techniques have been developed. One is a method of manufacturing a microstructure having a step by performing a primary etching process to a predetermined depth through anisotropic etching and patterning using a separate etch mask to perform etching twice. In this case, however, as the step increases, it becomes difficult to perform patterning using an etch mask, and thus the above method is applied only to the case of a lower step. Further, an additional process for forming a step is needed, and after forming the step, a process of forming a floating structure must be performed.

Meanwhile, a method of forming a step by anisotropically etching a substrate vertically using a wafer having a specific crystal orientation and an etching solution has been disclosed. However, this also requires a specific wafer and an etching solution.

Figure 1A:
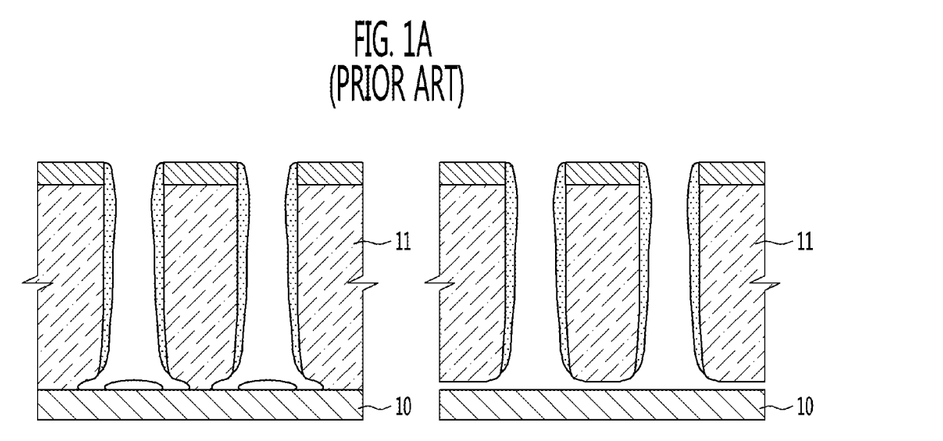
FIGS. 1A to 1C illustrate a conventional technique of manufacturing a 3D MEMS structure having a floating structure.
Figure 1B:
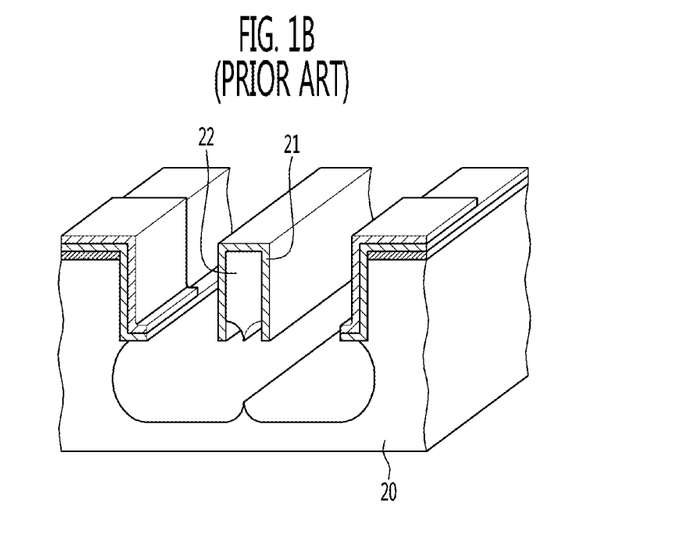
Figure 1C:
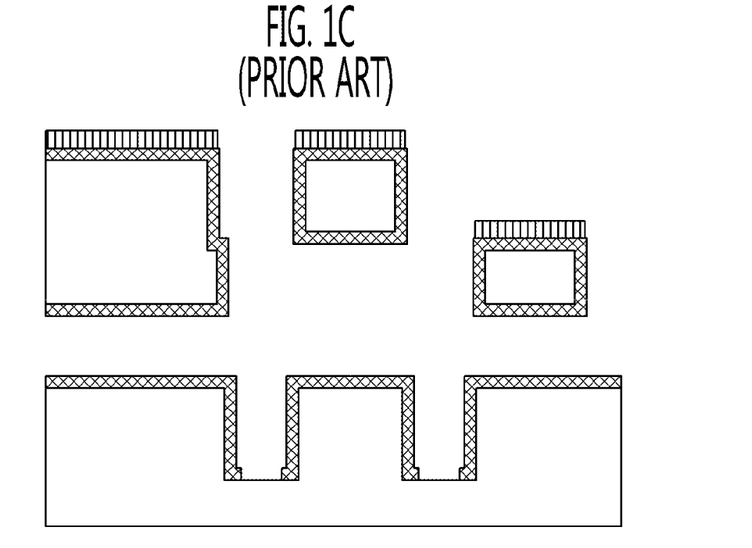

FIGS. 1A to 1C illustrate a conventional technique of manufacturing a 3D MEMS structure having a floating structure.

FIG. 1A illustrates a technique using a Si-on-Insulator (SOI) wafer. A floating structure is formed by performing constant anisotropic etching on a lower region of a silicon layer 11 to determine an etch depth with a silicon oxide layer disposed on a substrate 10. However, this technique requires a specific wafer such as an SOI wafer to produce a simple floating structure having no a step.

Meanwhile, FIG. 1B illustrates a technique in which a structure having a predetermined shape is formed on a silicon substrate 20 by anisotropic etching, and a side etching mask 21 is deposited and then isotropic etching is performed to from a floating structure 22. However, according to the above technique, since the floating structure 22 does not have a step, it cannot be applied to manufacturing a MEMS structure requiring vertical operation or detection.

FIG. 1C illustrates a technique using an orientation wafer. Specifically, dry anisotropic etching is performed on an orientation wafer to vertically etch a substrate to a predetermined depth, and wet anisotropic etching is performed on the substrate to be etched in a specific orientation. Thus, upper and lower regions of the structure are selectively etched. According to the above technique, a step can be precisely controlled and structures having multiple steps can be manufactured. However, the technique has disadvantages in that it requires a specific wafer and has lower compatibility with other processes.

Thus, there is an urgent need to develop a method of manufacturing a 3D MEMS structure including a floating structure having a step in a simple process without a specific wafer.

SUMMARY OF THE INVENTION

The present invention is directed to manufacturing a three-dimensional (3D) MEMS structure having a floating structure having at least one step in a simple process without a specific wafer.

The present invention is also directed to a method of controlling a depth of a step formed in a 3D MEMS structure by performing multi-steps of patterning or etching and controlling the extent.

One aspect of the present invention provides a method of manufacturing a 3D MEMS structure having a floating structure, including: depositing a first etch mask on a substrate; etching at least two regions of the first etch mask to expose the substrate, and forming at least one step in the etched region; partially etching the exposed region of the substrate using the first etch mask, and forming at least two grooves; depositing a second etch mask on a sidewall of the groove; and performing an etching process to connect lower regions of the at least two grooves to each other, and forming at least one floating structure.

The formation of the at least one step may include forming the first photoresist pattern on the first etch mask and etching the at least two regions of the first etch mask to a first depth, and forming a second photoresist pattern in at least a part of the exposed regions of the first etch mask and etching to a second depth.

The formation of the at least one step may further include forming a third photoresist pattern in at least a part of the exposed regions of the first etch mask and etching to a third depth.

The at least two grooves may be formed by anisotropic etching.

The deposition of the second etch mask may include depositing the second etch mask in the region including the region in which the groove is formed, and removing the region of the second etch mask deposited on the bottom of the groove by etching.

After the deposition of the second etch mask, the method may further include removing at least one of the at least one step of the first etch mask by etching to partially expose a top of the substrate.

The formation of the at least one floating structure may include partially etching a lower region of the at least two grooves by first etching, removing at least one of the at least one step of the first etch mask by etching to partially expose a top of the substrate, and performing second etching.

The formation of the at least one floating structure may further include removing at least one of the remaining steps of the first etch mask by etching to further partially expose a top of the substrate, and performing third etching.

The at least one floating structure may be etched by isotropic etching.

The method may further include removing the first and second etch masks, and forming a metal layer in a region seen from an upper region of the substrate.

The first and second etch masks may be formed of at least one of an oxide, a nitride and a polymer.

The substrate may be formed of a silicon material.

Still another aspect of the present invention provides a 3D MEMS structure, including: a floating structure and a fixed structure formed on the periphery of the floating structure and spaced a predetermined distance from the floating structure. At least one step is formed in at least a part of the floating or fixed structure.

The 3D MEMS structure may further include a metal layer formed on the floating and fixed structures.

The floating and fixed structures may be formed of a silicon material.

BRIEF DESCRIPTION OF THE DRAWINGS

The above and other objects, features and advantages of the present invention will become more apparent to those of ordinary skill in the art by describing in detail exemplary embodiments thereof with reference to the attached drawings in which.

DETAILED DESCRIPTION OF EXEMPLARY EMBODIMENTS

Hereinafter, the present invention will be described with reference to the accompanying drawings in detail. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout the specification. In the drawings, the thickness of layers and regions are exaggerated for clarity.

Throughout the specification, when a part "includes" an element, the part may include another element, unless otherwise defined.

Three-Dimensional MEMS Structure

Figure 2A:
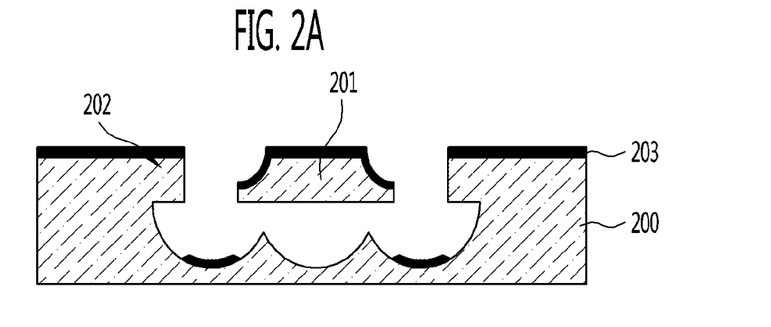
FIGS. 2A and 2B are cross-sectional views of a 3D MEMS structure according to an exemplary embodiment of the present invention.
Figure 2B:
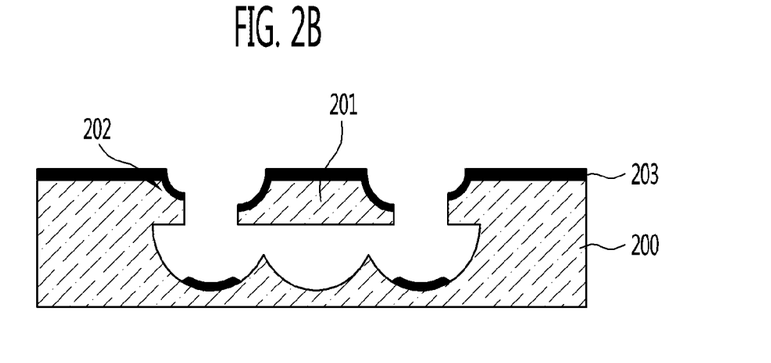

FIGS. 2A and 2B are cross-sectional views of a three-dimensional (3D) microelectromechanical system (MEMS) structure according to an exemplary embodiment of the present invention.

Referring to FIGS. 2A and 2B, a 3D MEMS structure may include a floating structure 201 and a fixed structure 202 formed on the periphery of the floating structure 201 and spaced a predetermined distance from the floating structure 201.

In the 3D MEMS structure, as shown in FIG. 2A, a step having a predetermined depth may be formed in at least a part of the floating structure 201, or steps may be formed on both of the floating structure 201 and the fixed structure 202 as shown in FIG. 2B.

Further, a metal layer 203 may be formed on the floating and fixed structures 201 and 202 to be in electric contact therebetween.

The floating and fixed structures 201 and 202 are formed by etching a substrate 200 formed of a silicon material in a predetermined pattern. A process of manufacturing such a 3D MEMS structure will now be described in detail.

Process of Manufacturing 3D MEMS Structure

First Exemplary Embodiment

FIGS. 3A to 3H are cross-sectional views illustrating a process of manufacturing a 3D MEMS structure according to a first exemplary embodiment of the present invention.

Figure 3A:
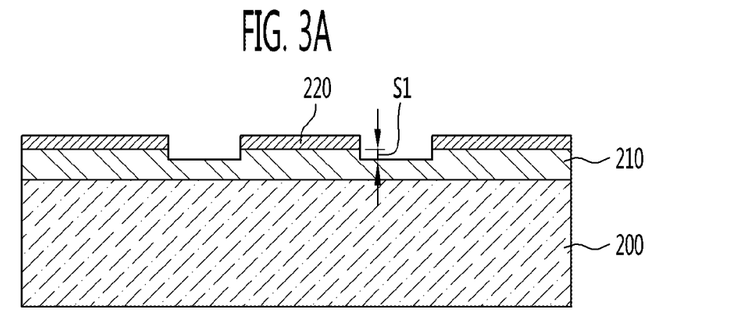
FIGS. 3A to 3H are cross-sectional views illustrating a process of manufacturing a 3D MEMS structure according to a first exemplary embodiment of the present invention.

First, as shown in FIG. 3A, a first etch mask 210 is stacked on a substrate 200, and a first step S1 is formed in at least one region of the first etch mask 210 using a first photoresist pattern 220. The first etch mask 210 is used to etch an upper region of the 3D MEMS structure. The substrate 200 may be formed of a silicon material, and the first etch mask 210 may be formed of an oxide, nitride or polymer. The first photoresist pattern 220 may be configured to expose the region of the first etch mask 210 to be removed. For example, the first photoresist pattern 220 may have the same shape as the uppermost side of the 3D MEMS structure. The first step S1 is formed by partially removing the first etch mask 210, and the removal of the first etch mask 210 may be accomplished by photolithography or etching. The first etch mask 210 may be removed up to some levels of depth to prevent exposure of the substrate 200. This is to form a plurality of steps in the first etch mask 210.

Figure 3B:
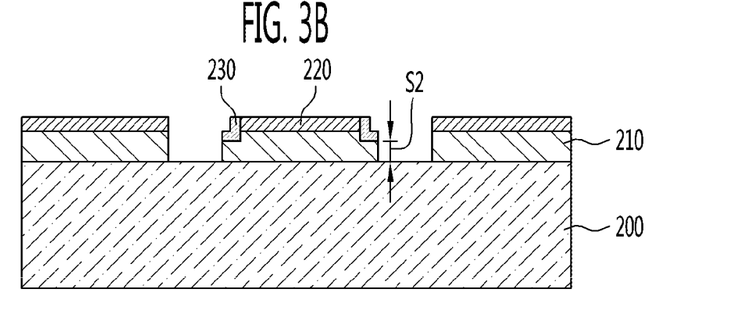

Afterwards, as shown in FIG. 3B, a second step S2 is formed by removing at least a part of the first etch mask 210 using a second photoresist pattern 230 covering at least a part of the exposed region of the first etch mask 210. To this end, the second photoresist pattern 230 may be formed to cover at least a part of the region in which the first step S1 is formed in the first etch mask 210. According to the exemplary embodiment of the present invention, the first step S1 of the first etch mask 210 may be formed in several other regions. In this case, the second photoresist pattern 230 formed in the region in which the first step S1 is formed may be formed at a location adjacent to another region in which the first step S1 is formed. The second step S2 is also formed by removing the region in which the first step S1 of the first etch mask 210 is formed, but not covered with the second photoresist pattern 230, by photolithography or etching. According to the above process, the substrate 200 is partially exposed. That is, the substrate 200 is exposed in the region not covered with the first and second photoresist patterns 220 and 230. As a result, the sum of the first and second steps S1 and S2 may be the same as the height of the first etch mask 210. Meanwhile, according to another embodiment, the sum of the first and second steps S1 and S2 may be smaller than the height of the first etch mask 210, which will be described below.

Figure 3C:
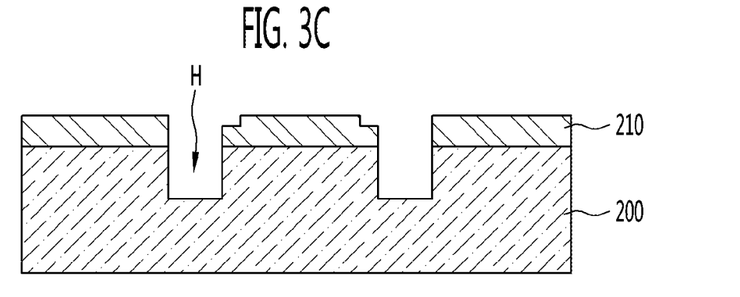

Subsequently, as shown in FIG. 3C, at least a part of the substrate 200 is removed using the first and second photoresist patterns 220 and 230 as masks, and the first and second photoresist patterns 220 and 230 are then removed. Because the first and second photoresist patterns 220 and 230 are used, the region in which the substrate 200 is removed is the same as the region in which the first etch mask 210 is removed as shown in FIG. 3B. Such a process may be performed by anisotropic etching which is performed at different rates according to crystal orientation. During anisotropic etching, an etch rate in a certain orientation may be higher than that in another orientation, and thus the substrate 200 may be etched in a vertical direction as shown in FIG. 3C. Here, the etching process may be dry etching. Accordingly, at least one groove H is formed in a predetermined region of the structure in which the substrate 200 and the first etch mask 210 are stacked.

Figure 3D:
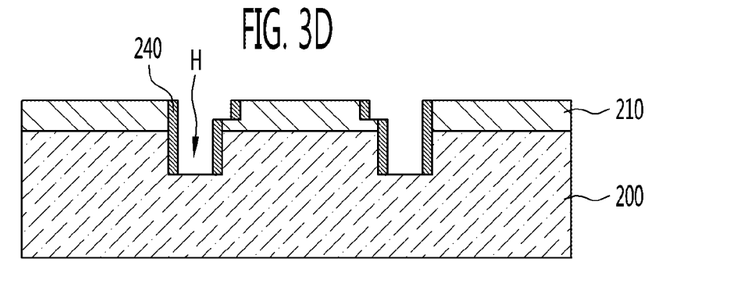

Then, as shown in FIG. 3D, a second etch mask 240 is formed on a sidewall of the groove H formed by etching the substrate 200. This prevents the sidewall of the groove H from being etched when the substrate 200 is configured to include a floating structure by isotopic etching. A process of forming the second etch mask 240 will be briefly described. First, a layer formed of a predetermined material is deposited on the region in which the groove H is formed. Here, the layer is also formed on the bottom of the groove H, but will be removed by etching (for example, anisotropic etching) to form the second etch mask 240 only on the sidewall of the groove H. The second etch mask 240 may be formed of an oxide, nitride or polymer.

Figure 3E:
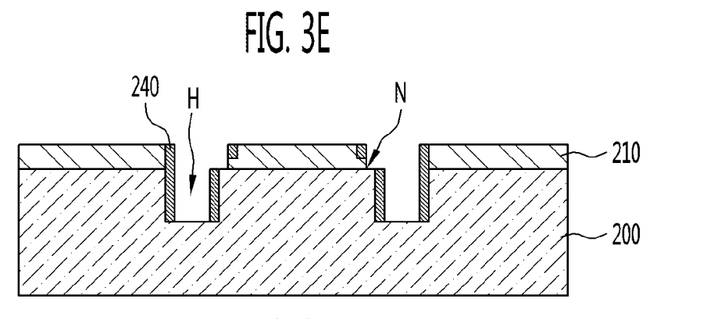

Meanwhile, the second step S2 formed in the process described with reference to FIG. 3B may be removed by etching. FIG. 3E illustrates a result obtained after the removal of the second step S2. This is provided to partially expose the substrate 200 in the region in which the second step S2 is formed. That is, the process serves to form at least a part of the region not covered with the first etch mask 210 of the uppermost side of the substrate 200. Accordingly, a region N that is not covered with the second etch mask 240 is created on the sidewall of the groove H by removing the second step S2.

Figure 3F:
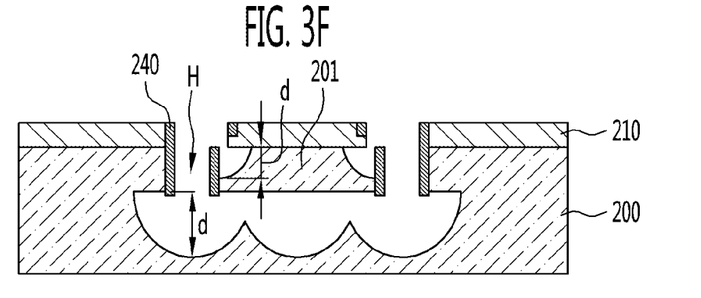

Afterwards, as shown in FIG. 3F, the structure is configured to have a floating structure 201 and a fixed structure 202 formed on the periphery of the floating structure 201 by etching. This process is performed by isotropically etching the structure shown in FIG. 3E. To be specific, by isotropically etching at the same rate with respect to all of the crystal orientations, the lowermost side of the groove H and the second step S2 are removed to start etching from the substrate 200 exposed thereby in all orientations. A predetermined space is formed in the lowermost side of the groove H by etching, and when such spaces formed in the lower region of the at least one groove H are connected by etching, the result may be obtained as shown in FIG. 3F. Here, the floating structure 201 has a step having a predetermined depth d, which may be the same as the depth d when the lower region of the groove H is removed by etching. Thus, the process described with reference to FIG. 3D, that is, the process of removing the second step S2 to partially expose a top of the substrate 200, not covered with the first etch mask 210, is performed. The depth d of the step may be controlled by adjusting the time or rate of the etching process. The isotropic etching may be isotropic gas phase etching.

Figure 3G:
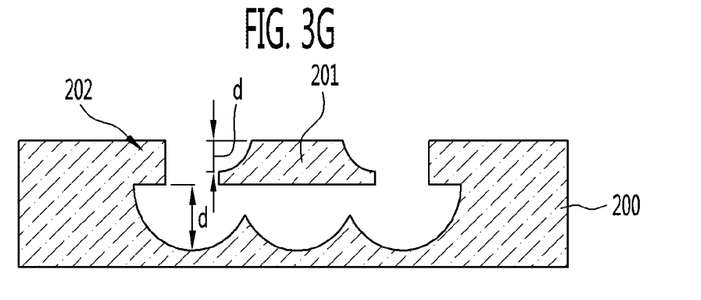
Figure 3H:
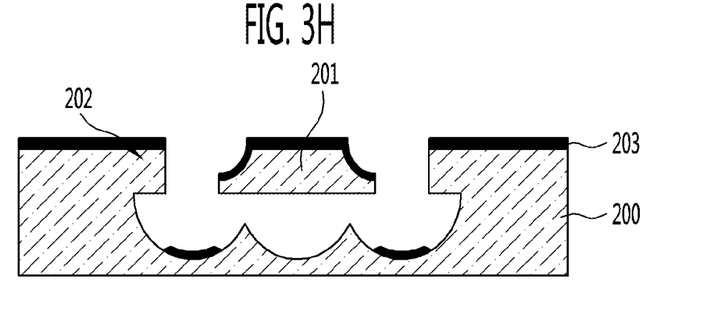

After the 3D MEMS structure including the floating structure 201 is formed, as shown in FIG. 3G, the first and second etch masks 210 and 240 are removed, and as shown in FIG. 3H, a metal layer 203 for electric connection may be formed on a surface seen from an upper region of the 3D MEMS structure. Thus, the entire process is completed.

Second Exemplary Embodiment

FIGS. 4A to 4H are views illustrating a process of manufacturing a 3D MEMS structure according to a second exemplary embodiment of the present invention.

Since the process illustrated with reference to FIGS. 4A to 4D is the same as that of manufacturing a 3D MEMS structure according to the first exemplary embodiment of the present invention, which is described with reference to FIG. 3D, detailed descriptions thereof will be omitted.

The difference of the second exemplary embodiment of the present invention from the first exemplary embodiment is that isotropic etching is performed twice throughout the process. Thus, the process will now be described with reference to FIGS. 4E to 4H in detail.

Figure 4A:
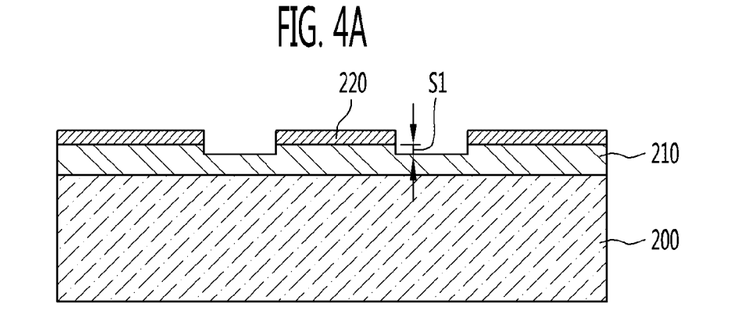
FIGS. 4A to 4H are cross-sectional views illustrating a process of manufacturing a 3D MEMS structure according to a second exemplary embodiment of the present invention.
Figure 4B:
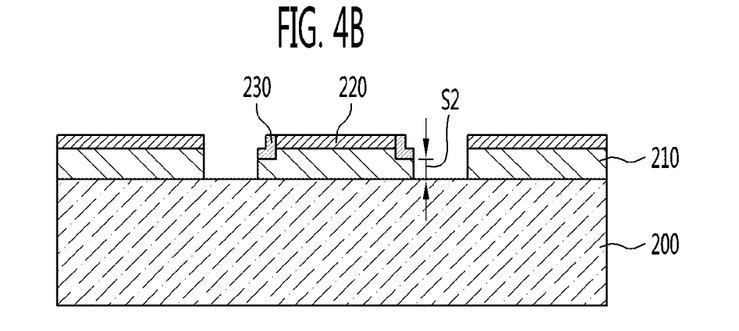
Figure 4C:
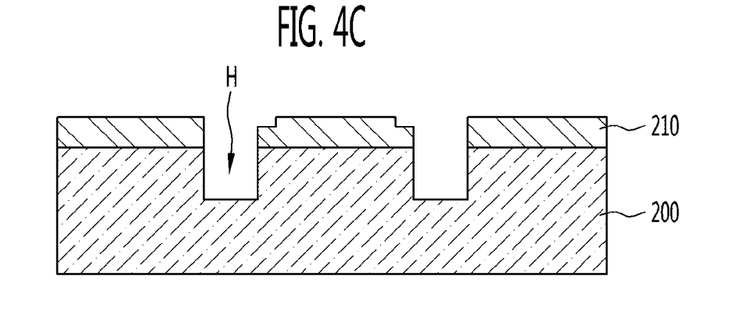
Figure 4D:
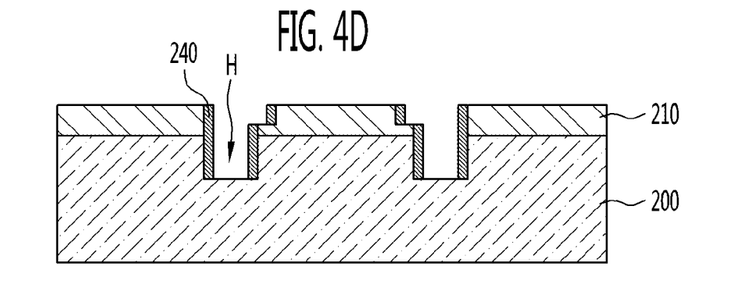
Figure 4E:
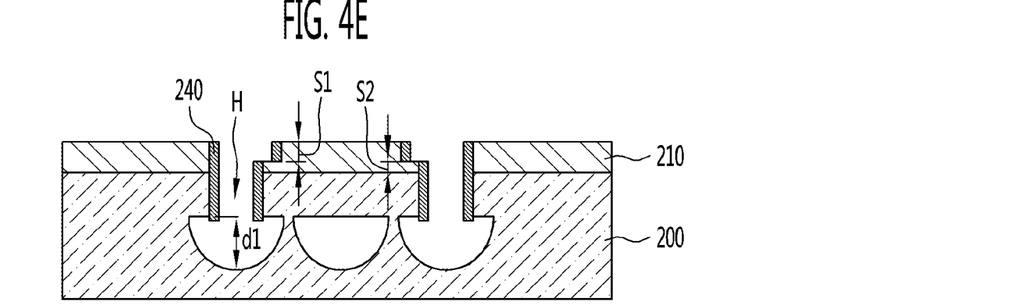

Referring to FIG. 4E, in the process of manufacturing a 3D MEMS structure according to the second exemplary embodiment of the present invention, before the process of removing the second step S2, first isotropic etching is performed. Due to the first etching, a bottom of the groove H is partially etched. A depth d1 of a lower region of the groove H created by the first isotropic etching can be adjusted as necessary in order to adjust a depth d2 of a step of a floating structure 201 (see FIG. 4F) to be formed. Here, the isotropic etching may be isotropic gas phase etching.

Figure 4F:
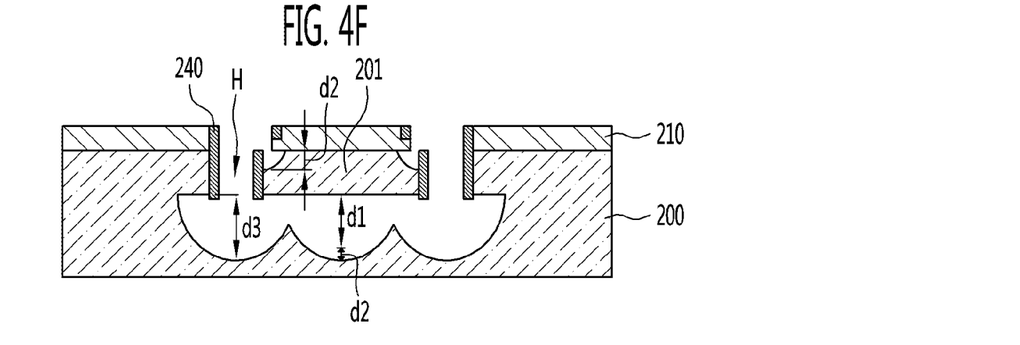

After the first isotropic etching, as shown in FIG. 4F, a region of the first etch mask 210 in which the second step S2 is formed is partially etched to expose at least a part of the top of the substrate 200, and then second isotropic etching is performed. The bottom of the groove H and the region in which the second step S2 is formed are etched to a predetermined depth d2 by the second isotropic etching. Thus, the groove H is connected to another groove H along the lower region, thereby forming a floating structure 201. The depth d2 can be adjusted as necessary. For this reason, the substrate 200 includes the floating structure 201 in which a lower etch space having a predetermined depth (d3=d1+d2) and the step having a predetermined depth d2 are formed.

According to the second exemplary embodiment of the present invention, the depth d2 of the step formed in the floating structure 201 may be different from the etch depth d3 of the groove H to form the floating structure 201. Thus, the depth d2 of the step may be controlled by appropriately adjusting the depth d1 of the space formed by first isotropic etching. For example, to make the depth d2 of the step small, the depth d1 of the space formed by first isotropic etching is designed to be similar to the minimum etch depth d3 of the groove H to form the floating structure 201, thereby reducing the depth d2 of the step formed in the floating structure 201.

Figure 4G:
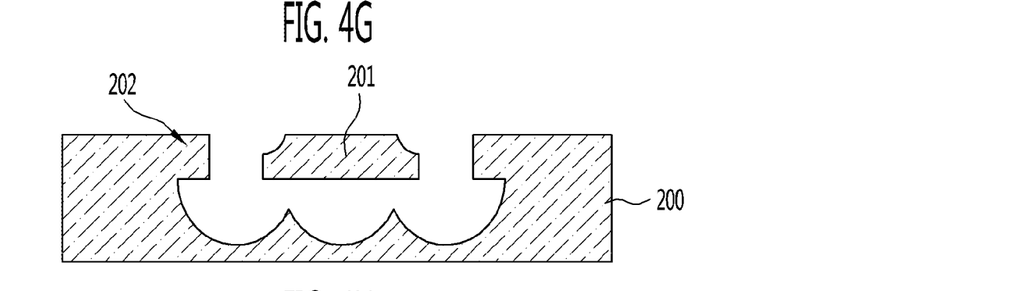
Figure 4H:
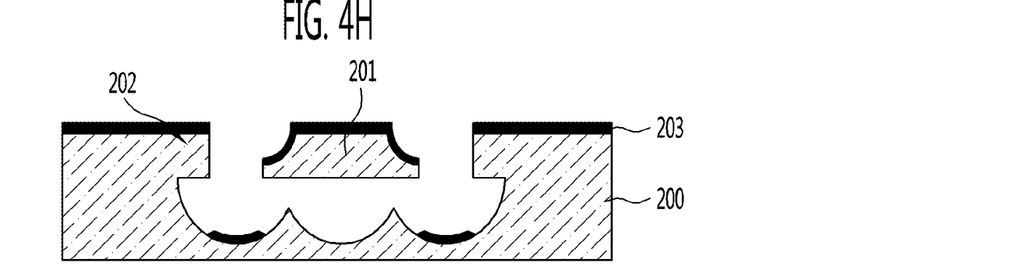

In the second exemplary embodiment, as shown in FIG. 4G, the first and second etch masks 210 and 240 are removed, and as shown in FIG. 4H, a metal layer 203 for electric connection is formed on a surface seen from an upper region of the 3D MEMS structure. Thus, the process of manufacturing the 3D MEMS structure including the floating structure 201 and the fixed structure 202 is completed.

Third Exemplary Embodiment

FIGS. 5A to 5F are cross-sectional views illustrating a process of manufacturing a 3D MEMS structure according to a third exemplary embodiment of the present invention.

Figure 5A:
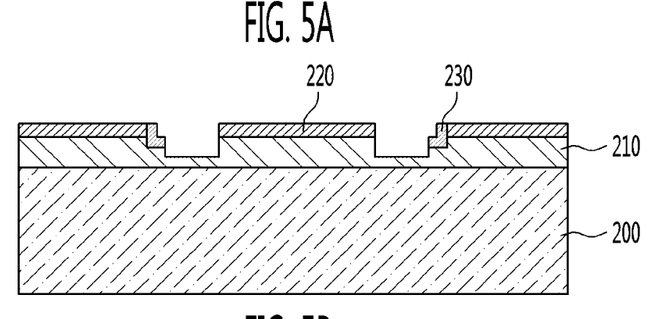
FIGS. 5A to 5F are cross-sectional views illustrating a process of manufacturing a 3D MEMS structure according to a third exemplary embodiment of the present invention.

A process obtaining the result shown in FIG. 5A is the same as that described with reference to FIGS. 3A and 3B. That is, the process of partially etching a first etch mask 210 using a first photoresist pattern 220, and forming a second photoresist pattern 230 in a part of the first etch mask 210 partially etched is the same as those in first and second exemplary embodiments. However, to form more steps, the etching, after the second photoresist pattern 230 is formed, is terminated before exposing a substrate 200. An etch depth may be adjusted as necessary, and etching may be anisotropic etching as described above.

Figure 5B:
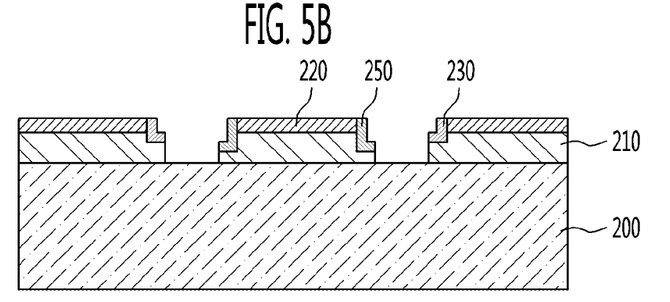

Subsequently, as shown in FIG. 5B, a third photoresist pattern 250 is formed in at least a part of the region in which the first etch mask 210 is exposed, and is used to perform etching again. At this time, the substrate 200 may be or may not be exposed by etching. When the substrate 200 is exposed by etching, a 3D MEMS structure in which one step is formed in each of a floating structure 201 (see FIG. 5F) and a fixed structure 202 (see FIG. 5F) is formed. When the substrate 200 is not exposed by etching, a 3D MEMS structure having a floating or fixed structure having more steps may be obtained by repeating etching using a separate photoresist pattern. As a result, the first etch mask 210 having a plurality of steps may be obtained.

Figure 5C:
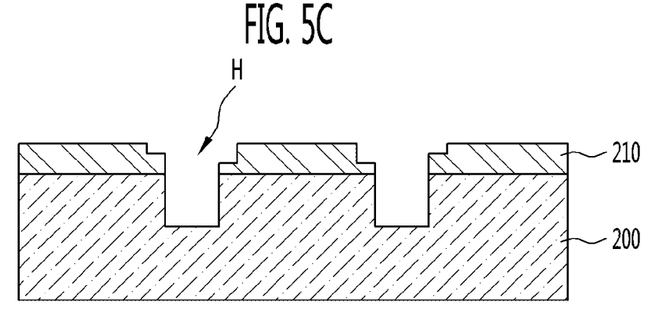

Afterwards, as shown in FIG. 5C, at least a part of the substrate 200 is removed using the first to third photoresist patterns 220, 230 and 250 as masks, and the first to third photoresist patterns 220, 230 and 250 are then removed. According to such a process, at least one groove H is formed in a predetermined region of the structure in which the substrate 200 and the first etch mask 210 are stacked.

Figure 5D:
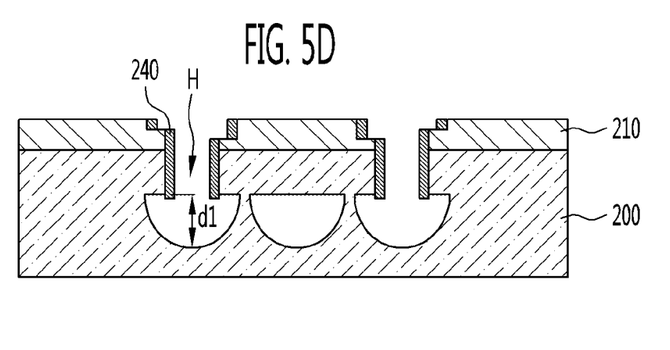
Figure 5E:
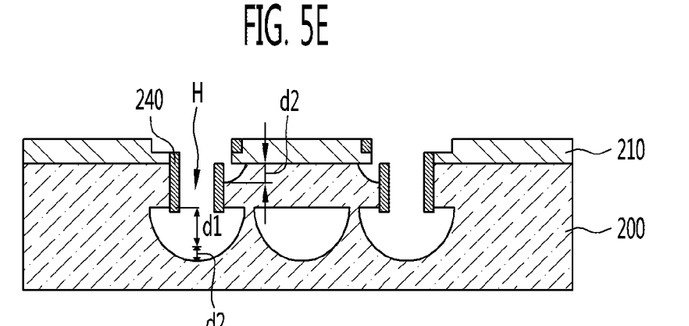

As shown in FIG. 5D, a second etch mask 240 is formed on a sidewall of the groove H, and then first isotropic etching is performed. Thus, a space having a predetermined depth d1 is formed toward a lower region of the groove H. The other region of the substrate 200 is not etched because it is protected by the first etch mask 210. Subsequently, as shown in FIG. 5E, a step present in at least one of the at least two regions of the first etch mask 210 in which steps are formed is removed to expose the substrate 200, and second isotropic etching is then performed. When the substrate 200 is etched to a predetermined depth d2, a depth of the space formed in the lower region of the groove H becomes d1+d2. An upper region of the substrate 200 exposed by removing the step of the first etch mask 210 is also etched to a depth of d2.

Figure 5F:
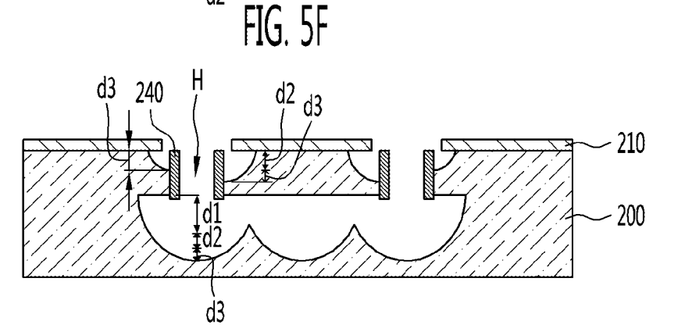

As shown in FIG. 5F, an un-removed step is removed in the first etch mask 210, and third isotropic etching is performed to connect the etched lower regions of the groove H, thereby obtaining a floating structure 201. Here, when etching is performed to a predetermined depth d3, a depth of the lower region of the groove H becomes d1+d2+d3, a step having a depth of d2+d3 is formed in an upper region of the substrate 200 etched to a depth of d2 by second isotropic etching, and the upper region of the substrate 200 in which the step is removed before third isotropic etching is etched to a depth of d3. As a result, the step may be formed in the fixed structure 202 as well as the floating structure 201, and a depth of the step formed in the floating structure 201, a depth of the step formed in the fixed structure 202 and a depth of the region formed by etching the groove H may all be different from each other. The depths of the steps formed in the floating structure 201 and the fixed structure 202 may be controlled by adjusting the extent of the first to third isotropic etching.

In FIGS. 5D to 5F, it is illustrated that first isotropic etching, removal of one of the two steps formed in the first etch mask 210, second isotropic etching, removal of the other step formed in the first etch mask 210, and third isotropic etching are sequentially performed. However, the order of these processes may be changed. For example, one of the two steps formed in the first etch mask 210 may be removed, or both of the steps may be simultaneously removed. Alternatively, after the removal of both of the steps, isotropic etching may be performed once. Depending on the depths of the steps to be formed in the floating and fixed structures 201 and 202, the processes may be performed in different orders.

However, the third exemplary embodiment may also be finished by removing the first and second etch masks 210 and 240 and forming a metal layer for electric connection on a surface seen from an upper region of the 3D MEMS structure.

According to the present invention, a 3D MEMS structure having a floating structure having at least one step can be manufactured by a simple process without a specific wafer.

Further, a depth of the step formed in the 3D MEMS structure is generally and precisely controlled by performing patterning or etching in multiple steps and adjusting the extent thereof.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A method of manufacturing a three-dimensional (3D) MEMS structure, comprising:
    depositing a first etch mask on a substrate;
    etching at least two regions of the first etch mask to expose the substrate, and forming at least one step in the at least two etched regions;
    partially etching the exposed regions of the substrate using the first etch mask, and forming at least two grooves;
    depositing a second etch mask on a sidewall of the at least two grooves;
    removing at least one of the at least one step of the first etch mask by etching to partially expose a top of the substrate after the second etch mask is deposited; and
    performing an isotropic etching process to connect lower regions of the at least two grooves to each other and to form at least one floating structure.

2. The method according to claim 1, wherein forming the at least one step comprises:
    forming a first photoresist pattern on the first etch mask, and etching the at least two regions of the first etch mask to a first depth; and
    forming a second photoresist pattern in at least a part of the exposed regions of the first etch mask, and etching to a second depth.

3. The method according to claim 2, wherein forming the at least one step further comprises forming a third photoresist pattern in at least a part of the exposed regions of the first etch mask, and etching to a third depth.

4. The method according to claim 1, wherein the at least two grooves are formed by anisotropic etching.

5. The method according to claim 1, wherein depositing the second etch mask comprises:
    depositing the second etch mask on a region in which the groove is formed; and
    removing a region of the second etch mask deposited on a bottom of the groove by etching.

6. The method according to claim 1, wherein forming the at least one floating structure comprises:
    partially etching a lower region of the at least two grooves by a first etching process;
    removing at least one of the at least one step of the first etch mask by etching to partially expose a top region of the substrate; and
    performing a second etching process.

7. The method according to claim 6, wherein forming the at least one floating structure further comprises:
- removing at least one of the remaining steps of the first etch mask by etching further to partially expose a top region of the substrate; and
- performing a third etching process.

8. The method according to claim 1, further comprising:
- removing the first and second etch masks; and
- forming a metal layer in a region seen from a plan view of the substrate.

9. The method according to claim 1, wherein the first and second etch masks are formed of at least one of an oxide, a nitride and a polymer.

10. The method according to claim 1, wherein the substrate is formed of a silicon material.

11. A method of manufacturing a three-dimensional (3D) MEMS structure, comprising:
- depositing a first etch mask on a substrate;
- etching at least two regions of the first etch mask to expose the substrate, and forming at least one step in the etched regions;
- partially etching the exposed regions of the substrate using the first etch mask, and forming at least two grooves;
- depositing a second etch mask on a sidewall of the at least two grooves; and
- performing an isotropic etching process to connect lower regions of the at least two grooves to each other and to form at least one floating structure, wherein forming the at least one step comprises:
- forming a first photoresist pattern on the first etch mask, and etching the at least two regions of the first etch mask to a first depth; and
- forming a second photoresist pattern in at least a part of the exposed regions of the first etch mask, and etching to a second depth.

12. The method according to claim 11, wherein forming the at least one step further comprises forming a third photoresist pattern in at least a part of the exposed regions of the first etch mask, and etching to a third depth.

13. The method according to claim 11, wherein the at least two grooves are formed by anisotropic etching.

14. The method according to claim 11, wherein depositing the second etch mask comprises:
- depositing the second etch mask on a region in which the groove is formed; and
- removing a region of the second etch mask deposited on a bottom of the groove by etching.

15. The method according to claim 11, further comprising, after depositing the second etch mask, removing at least one of the at least one step of the first etch mask by etching to partially expose a top of the substrate.

* * * * *